US008642376B2

(12) United States Patent
Chatterjee et al.

(10) Patent No.: US 8,642,376 B2
(45) Date of Patent: Feb. 4, 2014

(54) METHODS FOR DEPOSITING A MATERIAL ATOP A SUBSTRATE

(75) Inventors: Sukti Chatterjee, Cupertino, CA (US); Annamalai Lakshmanan, Fremont, CA (US); Joe Griffith Cruz, San Jose, CA (US); Pravin K. Narwankar, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/470,768

(22) Filed: May 14, 2012

(65) Prior Publication Data

US 2012/0295419 A1 Nov. 22, 2012

Related U.S. Application Data

(60) Provisional application No. 61/486,584, filed on May 16, 2011.

(51) Int. Cl.
*H01L 21/00* (2006.01)
*H01L 21/36* (2006.01)
*H01L 21/20* (2006.01)
*H01L 21/322* (2006.01)

(52) U.S. Cl.
USPC ............................. 438/97; 438/468; 438/478

(58) Field of Classification Search
USPC ............................................ 438/97, 468, 478
See application file for complete search history.

(56) References Cited

U.S. PATENT DOCUMENTS 7,981,776 B2 * 7/2011 Roschek et al. ............... 438/485
2010/0167461 A1 * 7/2010 Rana et al. ...................... 438/97
2012/0312326 A1 12/2012 Chatterjee et al.

OTHER PUBLICATIONS

U.S. Appl. No. 13/570,928, filed Aug. 9, 2012, Chatterjee.
U.S. Appl. No. 13/608,172, filed Sep. 10, 2012, Chatterjee et al.
International Search Report and Written Opinion mailed Jan. 24, 2012 for PCT Application No. PCT/US2012/041078.
International Search Report and Written Opinion mailed Mar. 4, 2012 for PCT Application No. PCT/US2012/054575.

* cited by examiner

*Primary Examiner* — Luan C Thai
(74) *Attorney, Agent, or Firm* — Moser Taboada; Alan Taboada

(57) ABSTRACT

Methods for depositing a material atop a substrate are provided herein. In some embodiments, a method of depositing a material atop a substrate may include exposing a substrate to a silicon containing gas and a reducing gas; increasing a flow rate of the silicon containing gas while decreasing a flow rate of the reducing gas to form a first layer; and depositing a second layer atop the first layer.

19 Claims, 5 Drawing Sheets

US 8,642,376 B2

METHODS FOR DEPOSITING A MATERIAL ATOP A SUBSTRATE

CROSS-REFERENCE TO RELATED APPLICATIONS

This application claims benefit of U.S. provisional patent application Ser. No. 61/486,584, filed May 16, 2011, which is herein incorporated by reference.

FIELD

Embodiments of the present invention generally relate to semiconductor substrate processing, and more particularly, to methods for depositing a material atop a substrate using hot wire chemical vapor deposition (HWCVD) techniques.

BACKGROUND

In hot wire chemical vapor deposition (HWCVD) processes, one or more precursor gases are thermally decomposed at a high temperature within a process chamber proximate a substrate upon which a desired material is to be deposited. The thermal decomposition reaction is facilitated within the process chamber by one or more wires, or filaments, supported in the process chamber that may be heated to a desired temperature, for example, by passing electrical current through the filaments.

Conventional HWCVD processes used to deposit materials for optical applications, for example such as silicon (Si) based opto-electronic grade films, often produces films having poor optical properties (e.g. a low visible energy range absorption co-efficient).

Therefore, the inventors have provided an improved method of depositing materials atop a substrate using HWCVD.

SUMMARY

Methods for depositing a material atop a substrate are provided herein. In some embodiments, a method of depositing a material atop a substrate may include exposing a substrate to a silicon containing gas and a reducing gas; increasing a flow rate of the silicon containing gas while decreasing a flow rate of the reducing gas to form a first layer; and depositing a second layer atop the first layer.

In some embodiments, a method of depositing a material atop a substrate may include (a) flowing a silicon containing gas into a hot wire chemical vapor deposition (HWCVD) chamber at a first flow rate for a first period of time to form a first species that reacts with a substrate disposed in the HWCVD chamber; (b) subsequently flowing a reducing gas into the HWCVD chamber at a second flow rate for a second period of time to form a second species that reacts with the substrate disposed in the HWCVD chamber; and (c) repeating (a)-(b) until the layer has a desired thickness.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
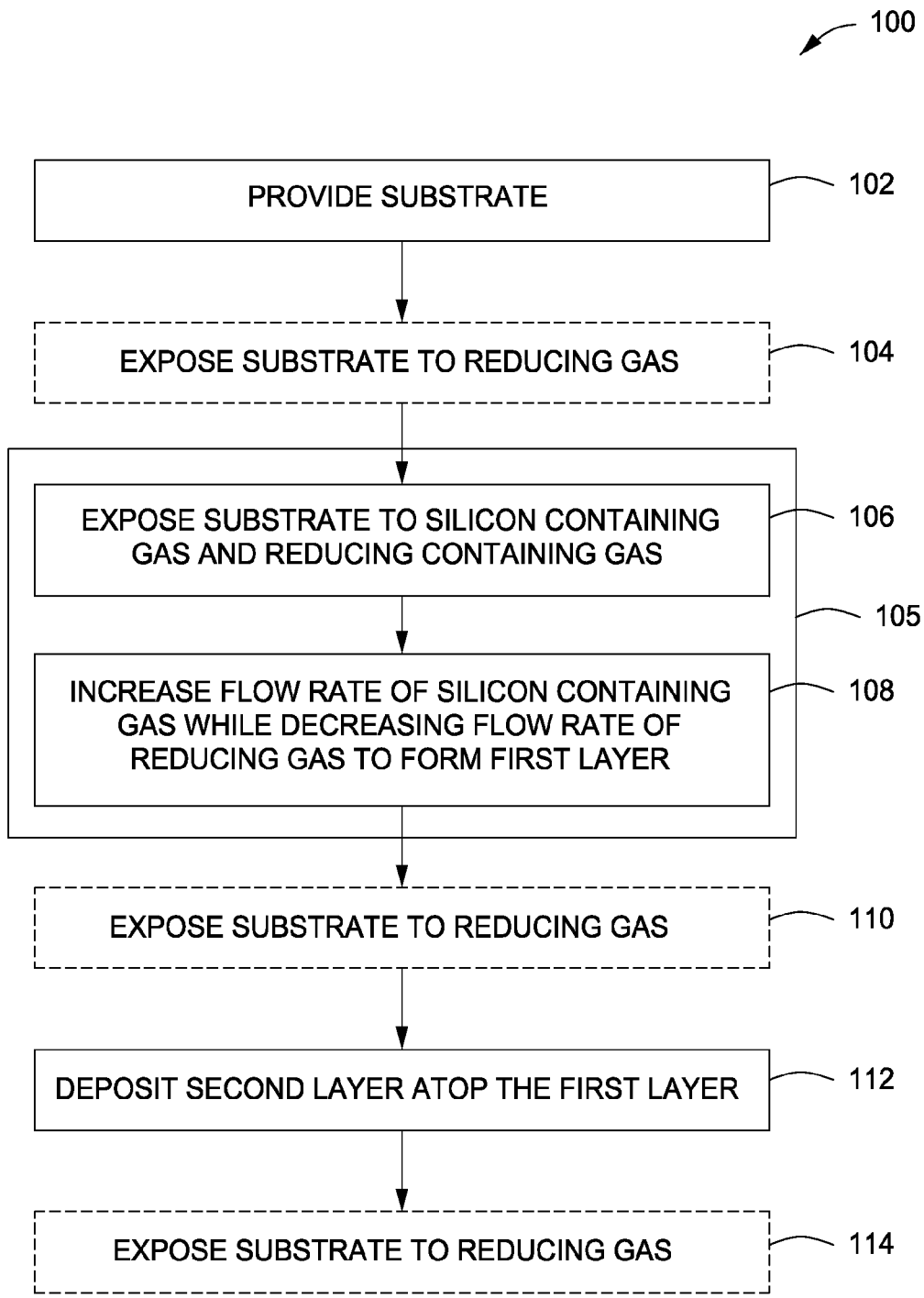
FIG. 1 is a flow diagram of a method for depositing a material atop a substrate in accordance with some embodiments of the present invention

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide methods for depositing materials atop substrates. Embodiments of the inventive methods may advantageously provide improved control over the state (i.e., crystalline or amorphous content) of the material being deposited. Embodiments of the inventive process may further advantageously provide improved optical properties of deposited materials (e.g., visible energy range absorption co-efficient) while maintaining consistent electronic properties (e.g., dark conductivity, photo response, or the like) as compared conventionally deposited materials. Although not limiting of the scope of application of the inventive methods disclosed herein, the inventive methods have been shown to be particularly effective for the deposition of opto-electronic grade films.

Figure 2A:
FIGS. 2A-C are illustrative cross-sectional views of a substrate during different stages of the processing sequence of FIG. 1 in accordance with some embodiments of the present invention.
Figure 2B:
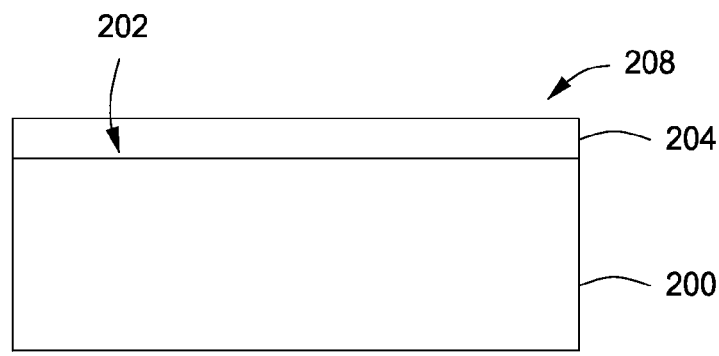
Figure 2C:
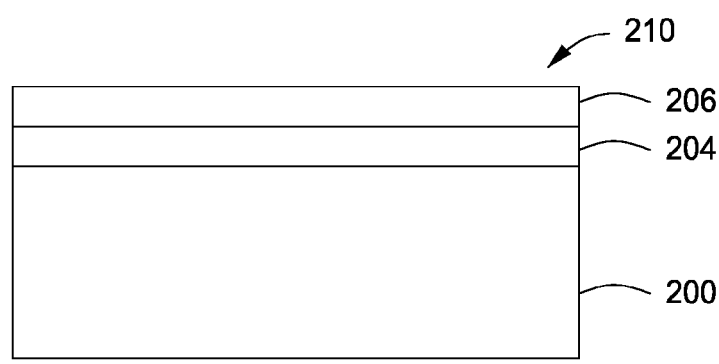

FIG. 1 is a flow diagram of a method 100 for depositing a material atop a substrate in accordance with some embodiments of the present invention. FIGS. 2A-C are illustrative cross-sectional views of the substrate during different stages of the processing sequence of FIG. 1 in accordance with some embodiments of the present invention. The inventive methods may be performed in any apparatus suitable for processing semiconductor substrates in accordance with embodiments of the present invention, such as the apparatus discussed below with respect to FIG. 5.

The method 100 generally begins at 102 where a substrate 200 is provided, as depicted in FIG. 2A. The substrate 200 may be any suitable substrate, such as a doped or un-doped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer, such as a 200 or 300 mm semiconductor wafer. In some embodiments, the substrate 200 may be a large scale LCD or glass substrate, for example, such as an about 1000 mm×1250 mm substrate or an about 2200 mm×2500 mm substrate.

In some embodiments, the substrate 200 may comprise one or more layers suitable for semiconductor fabrication, for example, oxide layers, nitride layers, high or low K dielectric layers, conductive layers, or the like. The layers may be formed via any suitable process, for example, such as physical vapor deposition, chemical vapor deposition, epitaxial growth, or the like. Alternatively or in combination, in some embodiments one or more features (e.g., a via, a trench, a dual damascene structure, or the like) may be formed in the substrate 200 and/or one or more layers formed thereon. The features may be formed via any suitable process, for example such as an etch process. In addition, the substrate 200 may undergo additional processing prior to preheating, such as annealing, baking, cleaning, or the like.

Next, at 104, the substrate 200 may be optionally exposed to a reducing gas. By exposing the substrate 200 to the reducing gas, an upper surface 202 of the substrate 200 may be conditioned to facilitate deposition of subsequent layers thereon (e.g. the first layer 204 described below). In some embodiments, the reducing gas may be any suitable gas containing hydrogen (e.g., a hydrogen containing gas). In some embodiments, the reducing gas may comprise hydrogen ($H_2$), which may avoid the introduction of undesired elements into the layer being grown. The reducing gas may be provided at any flow rate suitable to facilitate conditioning the upper surface 202 of the substrate 200. For example, in some embodiments where a 300 mm wafer is being processed, the reducing gas may be provided at a flow rate of about 5 to about 50 sccm, or in some embodiments, about 15 sccm. For example, in some embodiments where an about 2200 mm×2500 mm substrate is being processed, the reducing gas may be provided at a flow rate of about 50 to about 500 sccm. The flow rates for other substrate sizes will scale accordingly.

The reducing gas may be provided by itself or, in some embodiments, along with an inert carrier gas, such as nitrogen ($N_2$), helium (He), argon (Ar), or the like. When provided along with the carrier gas, the inert carrier gas and the reducing gas may be provided at a flow rate ratio of inert carrier gas to reducing gas of about 1:9 to about 9:1.

The substrate 200 may be exposed to the reducing gas for any amount of time suitable to allow the upper surface 202 of the substrate 200 to be conditioned. For example, in some embodiments, the substrate 200 may be exposed to the reducing gas for a period of time of about 10 to about 60 seconds.

In addition to the above, additional process parameters may be utilized to facilitate conditioning of the upper surface 202 of the substrate 200. For example, in some embodiments, the process chamber may be maintained at a pressure of about 10 to about 50 mTorr, or, in some embodiments, about 22 mTorr. In addition, in some embodiments, the process chamber may be maintained at a temperature of about 1600 to about 2000 degrees Celsius, or, in some embodiments, about 1700 degrees Celsius.

Next, at 105, a first layer 204 may be formed atop the substrate 200, as shown in FIG. 2C, by exposing the substrate 200 to an increasing amount of a silicon containing gas and a decreasing amount of a hydrogen containing gas over a period of time sufficient to form the first layer 204. For example, at 106, the substrate may be exposed to the reducing gas and the silicon containing gas. The reducing gas may be any suitable gas containing hydrogen, such as any of the reducing gases discussed above at 104. In some embodiments, the reducing gas may be the same, or in some embodiments, a different reducing gas than used when optionally exposing the substrate 200 to the reducing gas at 104. The reducing gas may be provided at any suitable flow rate. For example, in some embodiments where a 300 mm substrate is being processed, the reducing gas may be provided at a flow rate of about 5 to about 50 sccm, or in some embodiments, about 10 sccm. For example, in some embodiments where an about 2200 mm×2500 mm substrate is being processed, the reducing gas may be provided at a flow rate of about 50 to about 500 sccm. The flow rates for other substrate sizes will scale accordingly.

The silicon containing gas may be any suitable gas containing silicon (Si), for example such as silane ($SiH_4$), disilane ($Si_2H_6$), trisilane ($Si_3H_8$), or the like. The silicon containing gas may be provided at any flow rate, for example, such as about 5 to about 50 sccm, or in some embodiments, about 10 sccm.

Each of the reducing gas and silicon containing gas may be provided by itself or, in some embodiments, along with an inert carrier gas, such as nitrogen ($N_2$), helium (He), argon (Ar), or the like. When provided along with the carrier gas, the inert carrier gas and the reducing gas may be provided at a flow rate ratio of inert carrier gas to reducing gas of about 1:9 to about 9:1. When provided along with the carrier gas, the inert carrier gas and the silicon containing gas may be provided at a flow rate ratio of inert carrier gas to silicon containing gas of about 1:9 to about 9:1.

The substrate 200 may be exposed to the reducing gas and the silicon containing gas for any suitable amount of time. For example, in some embodiments, the substrate 200 may be exposed to the reducing gas and the silicon containing gas for a period of time of about 10 to about 60 seconds.

In addition to the above, additional process parameters may be utilized when exposing the substrate 200 to the reducing gas and the silicon containing gas. For example, in some embodiments, the process chamber may be maintained at a pressure of about 10 to about 50 mTorr, or in some embodiments, about 22 mTorr. In some embodiments, the filaments (e.g., wires 510 discussed below) of the HWCVD chamber may be maintained at a temperature of about 1600 to about 2000 degrees Celsius, or about 1700 degrees Celsius. In addition, in some embodiments, the substrate may be maintained at a temperature of about 200 to about 300 degrees Celsius, or about 230 degrees Celsius.

Next, at 108, the flow rate of the silicon containing gas may be increased while decreasing the flow rate of the hydrogen ($H_2$) gas to form a first layer 204 atop the substrate 200, as shown in FIG. 2C. The first layer 204 may be any type of material layer, for example an opto-electronic layer such as a silicon (Si) and hydrogen ($H_2$) film. In some embodiments, the first layer 204 may provide a template for a subsequently deposited layer, for example, such as the second layer 206 (shown in FIG. 2C) described below. The first layer 204 may comprise any thickness suitable for a particular application, for example, such as about 10 to about 100 angstroms (Å), or in some embodiments, less than about 100 Å.

By increasing the flow rate of the silicon containing gas while decreasing the flow rate of the hydrogen ($H_2$) gas to deposit the first layer 204, the inventors have discovered that the visible energy range absorption co-efficient of the first layer 204 may be significantly increased as compared to conventionally grown films while maintaining consistent electronic properties (e.g., dark conductivity, photo response, or the like). In addition, the inventors have observed improved control over the state of the material of the first layer (i.e., control over the order of amorphous network of the first layer 204). For example, as the silicon containing gas is increased the amorphous network order of the first layer 204 may decrease, thereby providing a controlled network order through the thickness of the first layer 204. For example, the amount of the silicon containing gas provided may be controlled to provide a controlled network order of the first layer 204, such as providing an increasing or decreasing crystalline gradient, or providing different portions of the first layer 104 having different crystallinity.

In some embodiments, increasing the flow rate of the silicon containing gas while decreasing the flow rate of the hydrogen ($H_2$) gas may be performed continuously over a period of time. For example, in some embodiments, the silicon containing gas may be increased from a flow rate of about 5 to about 20, or about 10 sccm to a flow rate of about 10 to about 20, or about 20 sccm over a period of time of about 10 to about 50. In such embodiments, the reducing gas may be decreased from a flow rate of about 20 to about 10, or about 10 sccm to a flow rate of about 10 to about 0, or about 0 sccm over a period of time of about 10 to about 60.

Alternatively, in some embodiments, the flow rate of the silicon containing gas may be increased and the flow rate of the reducing gas may be decreased in a plurality of sequential discrete steps. The number of steps, the duration of each step, the amount of increase of the silicon containing gas, and decrease of the reducing gas may be varied to obtain varied film properties and thicknesses. For example, in some embodiments, the silicon containing gas may first be provided at a flow rate of about 5 to about 10 sccm, or about 10 sccm, for a period of time of about 10 to about 60 seconds. The flow rate may then be increased to about 10 to about 50 sccm, or about 15 sccm, for a period of time of about 10 to about 60 seconds. The flow rate may then be again increased to about 15 to about 20 sccm, or about 20 sccm for a period of about 10 to about 60 seconds. The duration of each step may be the same or different.

Similarly, the reducing gas may first be provided at a flow rate of about 20 to about 10 sccm, or about 10 sccm, for a period of time of about 10 to about 60 seconds. The flow rate may then be decreased to about 15 to about 5 sccm, or about 5 sccm, for a period of time of about 10 to about 60 seconds. The flow rate may then be again decreased to about 10 to about 0 sccm, or about 0 sccm for a period of about 10 to about 60 seconds.

In addition to the above, additional process parameters may be utilized to facilitate forming the first layer 204 atop the substrate 200. For example, in some embodiments, the process chamber may be maintained at a pressure of about 10 to about 50 mTorr, or in some embodiments, about 22 mTorr. In addition, in some embodiments, the process chamber may be maintained at any temperature suitable to facilitate the decomposition of the silicon containing gas and reducing gas to form the first layer 204. For example, in some embodiments, the filaments (e.g., wires 510 discussed below) of the HWCVD chamber may be maintained at a temperature of about 1600 to about 2000 degrees Celsius, or about 1700 degrees Celsius. In addition, in some embodiments, the substrate may be maintained at a temperature of about 200 to about 300 degrees Celsius, or about 230 degrees Celsius.

Next, at 110, the substrate 200 may be optionally exposed to a reducing gas with no extra silicon containing gas provided. By exposing the substrate 200 to the reducing gas an upper surface 208 of the first layer 204 may be conditioned to facilitate deposition of subsequent layers, for example, the second layer 206 (shown in FIG. 2C) described below, thereon. The reducing gas may be any suitable gas containing hydrogen, for example such as any of the reducing gases discussed above. The reducing gas may be provided at any flow rate suitable to facilitate conditioning the upper surface 202 of the first layer 204. For example, in some embodiments, the reducing gas may be provided at a flow rate of about 5 to about 20 sccm, or in some embodiments, about 15 sccm.

The reducing gas may be provided by itself or, in some embodiments, along with an inert carrier gas, such as nitrogen ($N_2$), helium (He), argon (Ar), or the like. When provided along with the carrier gas, the inert carrier gas and the reducing gas may be provided at a flow rate ratio of inert carrier gas to reducing gas of about 1:9 to about 9:1.

The substrate 200 may be exposed to the reducing gas for any amount of time suitable to allow the upper surface 202 of the first layer 204 to be conditioned. For example, in some embodiments, the substrate 200 may be exposed to the reducing gas for a period of time of about 10 to about 60 seconds.

In addition to the above, additional process parameters may be utilized to facilitate conditioning of the upper surface 202 of the first layer 204. For example, in some embodiments, the process chamber may be maintained at a pressure of about 10 to about 50 mTorr, or in some embodiments, about 22 mTorr. In some embodiments, the filaments (e.g., wires 510 discussed below) of the HWCVD chamber may be maintained at a temperature of about 1600 to about 2000 degrees Celsius, or about 1700 degrees Celsius. In addition, in some embodiments, the substrate may be maintained at a temperature of about 200 to about 300 degrees Celsius, or about 230 degrees Celsius.

Table 1, below, depicts an exemplary embodiment of the method 100 where the reducing gas is hydrogen ($H_2$) and the silicon containing gas is silane ($SiH_4$), wherein the deposition occurs in three discrete steps, and wherein conditioning processes using only the reducing gas are provided before and after the deposition (subsequent deposition of the second layer is omitted and is discussed below with respect to FIGS. 3-4). This example is meant to be illustrative only and not limiting of the invention. For example, different reducing gases and/or silicon containing gases (and/or flow rates thereof) may be used. Alternatively or in combination, greater or fewer deposition steps may be used, or a continuous gas flow adjustment may be used rather than a discrete one. Also, the pre- and/or post- deposition conditioning steps may be omitted.

TABLE 1

| Method 100 (300 mm wafer example) | Reducing gas ($H_2$) | Si containing gas ($SiH_4$) | Duration (seconds) |
|---|---|---|---|
| 104 (Conditioning) | 15 sccm | 0 sccm | 30 |
| 105 (Deposition) | 10 sccm | 10 sccm | 20 |
| 105 (Deposition) | 5 sccm | 15 sccm | 10 |
| 105 (Deposition) | 0 sccm | 20 sccm | Deposition time |
| 110 (Conditioning) | 15 sccm | 0 sccm | 30 |

Next, at 112, a second layer 206 may be deposited atop the first layer 204, as shown in FIG. 2C. The second layer 206 may comprise any materials suitable for a particular application. For example, in some embodiments, the second layer 206 may an opto-electronic layer such as a silicon and hydrogen containing film. In addition, in some embodiments, the second layer 206 may comprise the same, or in some embodiments, different materials than the first layer 204. The second layer 206 may comprise any thickness suitable for a particular application, for example, such as about 500 to about 50,000 angstroms (Å). In some embodiments, the second layer 206 may be thicker than the first layer 204. In some embodiments, the second layer 206 may be a bulk layer that is deposited over the first layer 204, which may act as a seed layer or template layer for the bulk layer.

The second layer 206 may be deposited in any suitable manner, for example such as chemical vapor deposition, physical vapor deposition, or the like. In some embodiments, the second layer 206 may be deposited via the method described below with respect to FIG. 3.

Next, at 114, the substrate 200 may be optionally exposed to a reducing gas. By exposing the second layer 206 to the reducing gas an upper surface 210 of the second layer 206 may be conditioned to facilitate deposition of subsequent layers thereon. The reducing gas may be any suitable gas containing hydrogen, for example such as the reducing gases described above. The reducing gas may be provided at any flow rate suitable to facilitate conditioning the upper surface 210 of the second layer 206. For example, in some embodiments, the reducing gas may be provided at a flow rate of about 5 to about 50 sccm, or in some embodiments, about 15 sccm.

The reducing gas may be provided by itself or, in some embodiments, along with an inert carrier gas, such as nitrogen ($N_2$), helium (He), argon (Ar), or the like. When provided along with the carrier gas, the inert carrier gas and the reducing gas may be provided at a flow rate ratio of inert carrier gas to reducing gas of about 1:9 to about 9:1.

The second layer 206 may be exposed to the reducing gas for any amount of time suitable to allow the upper surface 210 of the second layer 206 to be conditioned. For example, in some embodiments, the second layer 206 may be exposed to the reducing gas for a period of time of about 10 to about 60 seconds.

In addition to the above, additional process parameters may be utilized to facilitate conditioning of the upper surface 210 of the second layer 206. For example, in some embodiments, the process chamber may be maintained at a pressure of about 10 to about 50 mTorr, or in some embodiments, about 22 mTorr. In addition, in some embodiments, the process chamber may be maintained at a temperature of about 1600 to about 2000 degrees Celsius, or about 1700 degrees Celsius.

Upon completion of depositing the second layer 206 atop the first layer 204, the method 100 generally ends and additional processes (e.g., etch, deposition, annealing, or the like) may be performed on the substrate 200 as desired. For example, in some embodiments, additional layers may be deposited atop the substrate 200. In such embodiments, the subsequent deposition processes may be performed similar to the method 100 as described above.

Figure 3:
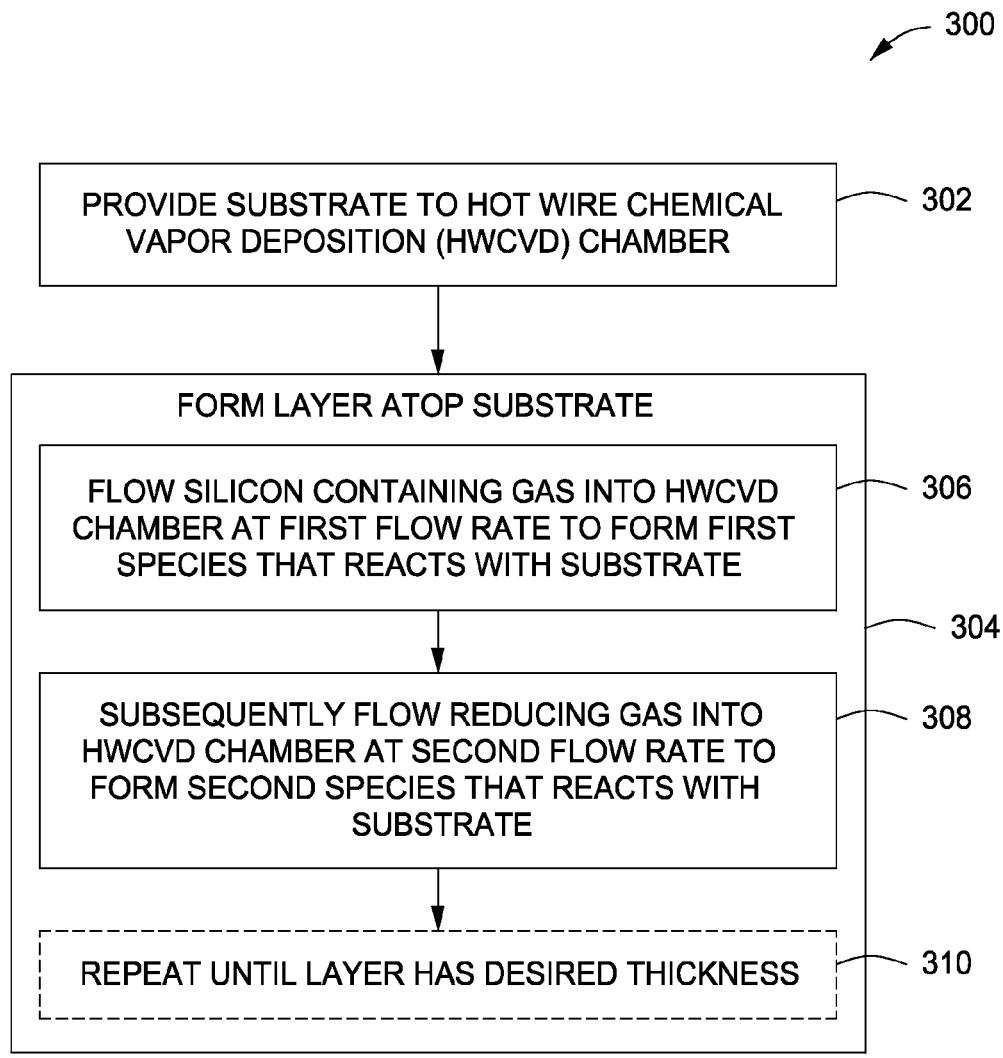
FIG. 3 is a flow diagram of a method for depositing a material atop a substrate in accordance with some embodiments of the present invention
Figure 4A:
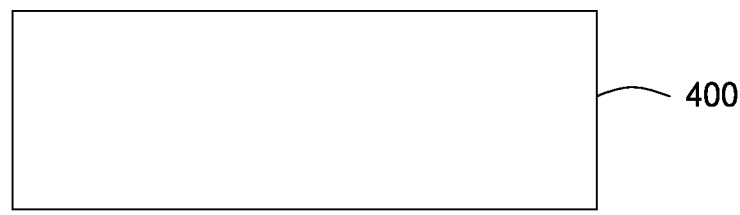
FIGS. 4A-C are illustrative cross-sectional views of a substrate during different stages of the processing sequence of FIG. 3 in accordance with some embodiments of the present invention.
Figure 4B:
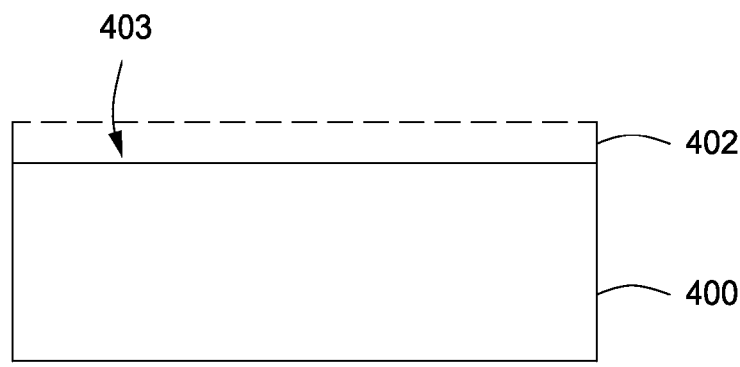
Figure 4C:
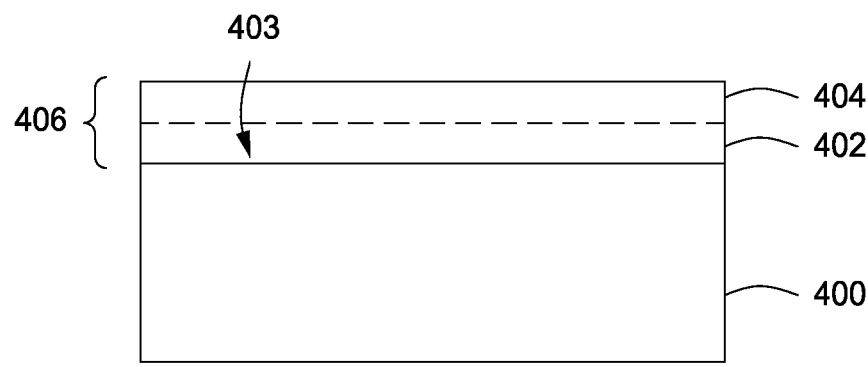

FIG. 3 is a flow diagram of a method 300 for depositing a material atop a substrate in accordance with some embodiments of the present invention. FIGS. 4A-C are illustrative cross-sectional views of a substrate during different stages of the processing sequence of FIG. 3 in accordance with some embodiments of the present invention. The inventive methods may be performed in any apparatus suitable for processing semiconductor substrates in accordance with embodiments of the present invention, such as the apparatus discussed below with respect to FIG. 5. In some embodiments, the method 300 may be utilized to deposit the second layer 206 atop the first layer 204, as described above with respect to the method 100.

The method 300 generally begins at 302 where a substrate 400 is provided to a hot wire chemical vapor deposition chamber (HWCVD) (for example, as described below with respect to FIG. 5), as depicted in FIG. 4A. The substrate 400 may be any suitable substrate, for example, such as the substrates described above with respect to FIGS. 1 and 2. The substrate 400 may be similar to the substrate 200 described above with respect to FIGS. 1-2. In some embodiments, the substrate 400 may be the substrate 200.

Next, at 304, a layer 406 (shown in FIG. 4C) may be formed atop the substrate 400. The layer 406 may be any type of material layer, for example an opto-electronic layer such as a silicon and hydrogen containing film. The layer 406 may comprise any thickness suitable for a particular application, for example, such as about 500 to about 50,000 angstroms. As noted above, in some embodiments, the layer 406 may be the layer 206 discussed with respect to FIGS. 1-2.

To form the layer 406, first, at 304, a silicon containing gas may be flowed into the HWCVD chamber at a first flow rate for a first period of time to form a first species that reacts with the substrate 400. By exposing the substrate 400 to the first species from the silicon containing gas, a first layer 402 comprising silicon (Si) may be formed, as shown in FIG. 4B. The silicon containing gas containing gas may be any suitable gas containing silicon (Si), such as any of the silicon containing gases discussed above. In some embodiments, the silicon containing gas may be silane ($SiH_4$). In some embodiments, the silicon containing gas is provided with no additional reducing gas being provided. The first flow rate may be any flow rate suitable to provide even distribution of the silicon containing gas across the surface 403 of the substrate 400, for example, to facilitate forming a substantially uniform layer 402. For example, in some embodiments, the first flow rate may be about 5 to about 200 sccm, or in some embodiments, about 15 sccm.

In some embodiments, the silicon containing gas may be provided by itself or, in some embodiments, along with an inert carrier gas, such as nitrogen ($N_2$), helium (He), argon (Ar), or the like. When provided along with the carrier gas, the inert carrier gas and the silicon containing gas may be provided at a flow rate ratio of inert carrier gas to silicon containing gas of about 1:9 to about 9:1.

The first period of time may be any amount of time suitable to form a layer of silicon (Si) atop the surface 403 of the substrate 400. For example, in some embodiments, the substrate 400 may be exposed to the silicon containing gas for a period of time of about 10 to about 60 seconds.

In addition to the above, additional process parameters may be utilized when exposing the substrate 400 to the silicon containing gas. For example, in some embodiments, the process chamber may be maintained at a pressure of about 10 to about 50 mTorr. In addition, the process chamber may be maintained at any temperature suitable to facilitate the decomposition of the silicon containing gas to form the first layer 402. For example, in some embodiments, the filaments (e.g., wires 510 discussed below) of the HWCVD chamber may be maintained at a temperature of about 1600 to about 2000 degrees Celsius, or about 1700 degrees Celsius. In addition, in some embodiments, the substrate may be maintained at a temperature of about 200 to about 300 degrees Celsius, or about 230 degrees Celsius.

Next, at 308, a reducing gas may be subsequently flowed into the HWCVD chamber at a second flow rate for a second period of time to form a second species that reacts with the substrate 400. By exposing the substrate 400 to the second species formed from the reducing gas, a second layer 404 comprising hydrogen (H) is formed atop the first layer 402, as shown in FIG. 4C. The first layer 402 and second layer 404 react, forming the layer 406.

The reducing gas may be any suitable gas containing hydrogen, such as any of the reducing gases discussed above. In some embodiments, the reducing gas may be hydrogen ($H_2$). In some embodiments, the reducing gas is provided with no additional silicon containing gas being provided. The second flow rate may be any flow rate suitable to provide even distribution of the reducing gas across the surface 403 of the substrate 400, for example, to facilitate forming a substantially uniform layer 404. For example, in some embodiments, the second flow rate may be about 5 to about 50 sccm, or in some embodiments, about 15 sccm.

In some embodiments, the reducing gas may be provided by itself or, in some embodiments, along with an inert carrier gas, such as nitrogen ($N_2$), helium (He), argon (Ar), or the like. When provided along with the carrier gas, the inert carrier gas and the reducing gas may be provided at a flow rate ratio of inert carrier gas to reducing gas of about 1:9 to about 9:1.

The second period of time may be any amount of time suitable to form a layer comprising hydrogen atop the first layer 402 of the substrate 400. For example, in some embodiments, the substrate 400 may be exposed to the reducing gas for a period of time of about 10 to about 60 seconds.

In addition to the above, additional process parameters may be utilized when exposing the substrate 400 to the reducing gas. For example, in some embodiments, the process chamber may be maintained at a pressure of about 10 to about 50 mTorr. In addition, the process chamber may be maintained at any temperature suitable to facilitate the decomposition of the reducing gas to form the second layer 404. For example, in some embodiments, the filaments (e.g., wires 510) in the process chamber may be maintained at a temperature of about 1600 to about 2000 degrees Celsius.

In some embodiments, the above sequence (i.e., 306 and 308) may be repeated until the desired thickness is achieved, as indicated at 310. Accordingly, forming a layer atop a substrate 303 may require between 10 and 100 cycles, or in some embodiments, about 20 cycles to reach the desired thickness.

Upon completion of depositing the layer 406 atop the substrate 400, the method 300 generally ends and additional processes (e.g., an etch, deposition, annealing, or the like) may be performed on the substrate 400 as desired.

Figure 5:
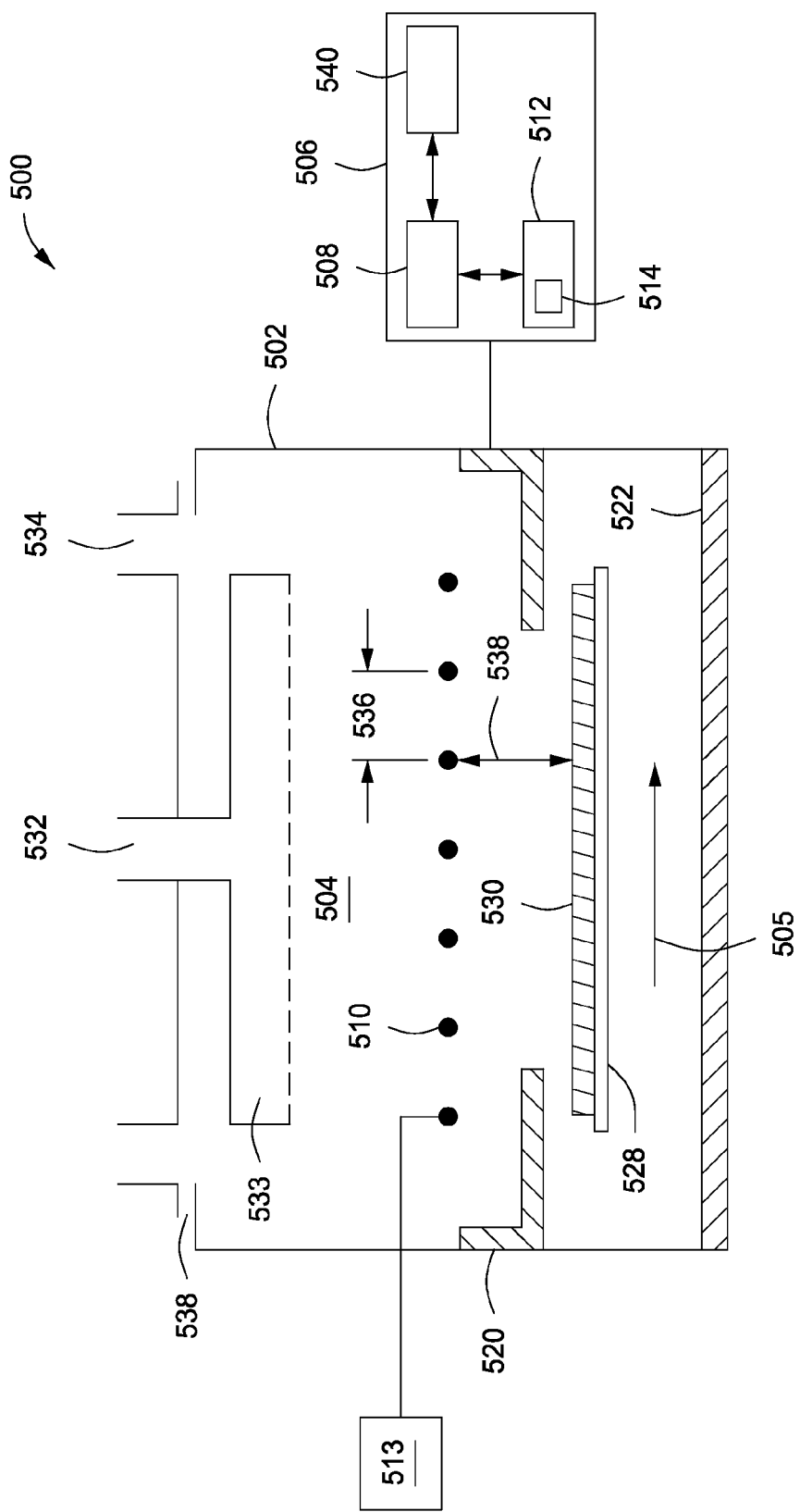
FIG. 5 is simplified schematic side view of a process chamber suitable for performing the methods depicted in FIGS. 1 and 3 in accordance with some embodiments of the present invention.

FIG. 5 depicts a schematic side view of a HWCVD process chamber 500 suitable for use in accordance with embodiments of the present invention. The process chamber 500 generally comprises a chamber body 502 having an internal processing volume 504. A plurality of filaments, or wires 510, are disposed within the chamber body 502 (e.g., within the internal processing volume 504). The plurality of wires 510 may also be a single wire routed back and forth across the internal processing volume 504. The plurality of wires 510 comprise a HWCVD source. The wires 510 may comprise any suitable conductive material, for example, such tungsten, tantalum, iridium, or the like. The wires may 510 comprise any thickness suitable to provide a desired temperature to facilitate a process in the process chamber 500. For example, in some embodiments, each wire 510 may comprise a diameter of about 0.25 to about 1 mm, or in some embodiments, about 0.5 mm.

Each wire 510 is clamped in place by support structures (not shown) to keep the wire taught when heated to high temperature, and to provide electrical contact to the wire. In some embodiments, a distance between each wire 510 (i.e., the wire to wire distance 536) may be varied to provide a desired temperature profile within the process chamber 500. For example, in some embodiments, the wire to wire distance 536 may be about 45 to about 90 mm, or in some embodiments about 60 mm.

A power supply 513 is coupled to the wire 510 to provide current to heat the wire 510. A substrate 530 may be positioned under the HWCVD source (e.g., the wires 510), for example, on a substrate support 528. The substrate support 528 may be stationary for static deposition, or may move (as shown by arrow 505) for dynamic deposition as the substrate 530 passes under the HWCVD source. In some embodiments, a distance between each wire 510 and the substrate 538 (i.e., the wire to substrate distance 538) may be varied to facilitate a particular process being performed in the process chamber 500. For example, in some embodiments, the wire to substrate distance 538 may be about 20 to about 100 mm, or in some embodiments about 45 mm.

The chamber body 502 further includes one or more gas inlets (one gas inlet 532 shown) to provide one or more process gases and one or more outlets (two outlets 534 shown) to a vacuum pump to maintain a suitable operating pressure within the process chamber 500 and to remove excess process gases and/or process byproducts. The gas inlet 532 may feed into a shower head 533 (as shown), or other suitable gas distribution element, to distribute the gas uniformly, or as desired, over the wires 510.

In some embodiments, one or more shields 520 may be provided to minimize unwanted deposition on interior surfaces of the chamber body 502. Alternatively or in combination, one or more chamber liners 522 can be used to make cleaning easier. The use of shields, and liners, may preclude or reduce the use of undesirable cleaning gases, such as the greenhouse gas $NF_3$. The shields 520 and chamber liners 522 generally protect the interior surfaces of the chamber body from undesirably collecting deposited materials due to the process gases flowing in the chamber. The shields 520 and chamber liners 522 may be removable, replaceable, and/or cleanable. The shields 520 and chamber liners 522 may be configured to cover every area of the chamber body that could become coated, including but not limited to, around the wires 510 and on all walls of the coating compartment. Typically, the shields 520 and chamber liners 522 may be fabricated from aluminum (Al) and may have a roughened surface to enhance adhesion of deposited materials (to prevent flaking off of deposited material). The shields 520 and chamber liners 522 may be mounted in the desired areas of the process chamber, such as around the HWCVD sources, in any suitable manner. In some embodiments, the source, shields, and liners may be removed for maintenance and cleaning by opening an upper portion of the deposition chamber. For example, in some embodiments, the a lid, or ceiling, of the deposition chamber may be coupled to the body of the deposition chamber along a flange 538 that supports the lid and provides a surface to secure the lid to the body of the deposition chamber.

A controller 506 may be coupled to various components of the process chamber 500 to control the operation thereof. Although schematically shown coupled to the process chamber 500, the controller may be operably connected to any component that may be controlled by the controller, such as the power supply 512, a gas supply (not shown) coupled to the inlet 532, a vacuum pump and or throttle valve (not shown) coupled to the outlet 534, the substrate support 528, and the like, in order to control the HWCVD deposition process in accordance with the methods disclosed herein. The controller 506 generally comprises a central processing unit (CPU) 508, a memory 512, and support circuits 510 for the CPU 508. The controller 506 may control the HWCVD process chamber 500 directly, or via other computers or controllers (not shown) associated with particular support system components. The controller 506 may be one of any form of general-purpose computer processor that can be used in an industrial setting for controlling various chambers and sub-processors. The memory, or computer-readable medium, 512 of the CPU 508 may be one or more of readily available memory such as random access memory (RAM), read only memory (ROM), floppy disk, hard disk, flash, or any other form of digital storage, local or remote. The support circuits 510 are coupled to the CPU 508 for supporting the processor in a conventional manner. These circuits include cache, power supplies, clock circuits, input/output circuitry and subsystems, and the like. Inventive methods as described herein may be stored in the memory 512 as software routine 514 that may be executed or invoked to turn the controller into a specific purpose controller to control the operation of the process chamber 500 in the manner described herein. The software routine may also be stored and/or executed by a second CPU (not shown) that is remotely located from the hardware being controlled by the CPU 508.

Thus, methods for depositing materials atop substrates are provided herein. The inventive methods may advantageously provide an improved control over the state (i.e., crystalline or amorphous content) of the material being deposited. Embodiments of the inventive process may further advantageously provide improved optical properties of deposited materials (e.g., visible energy range absorption co-efficient) while maintaining consistent electronic properties (e.g., dark conductivity, photo response, or the like) of conventionally deposited materials. Although not limiting of the scope of application of the inventive methods disclosed herein, the inventive methods have been shown to be particularly effective for the deposition of opto-electronic grade films.

While the foregoing is directed to embodiments of the present invention, other and further embodiments of the invention may be devised without departing from the basic scope thereof.

The invention claimed is:

1. A method of depositing a material atop a substrate, comprising:
    exposing a substrate to a silicon containing gas and a reducing gas;
    increasing a flow rate of the silicon containing gas while decreasing a flow rate of the reducing gas to form a first layer; and
    depositing a second layer atop the first layer, wherein depositing the second layer atop the first layer comprises:
        (a) flowing a silicon containing gas into a hot wire chemical vapor deposition (HWCVD) chamber at a first flow rate for a first period of time to form a first species that reacts with the substrate, wherein the substrate is disposed in the HWCVD chamber;
        (b) subsequently flowing a reducing gas alone or in combination with an inert carrier gas into the HWCVD chamber at a second flow rate for a second period of time to form a second species that reacts with the substrate disposed in the HWCVD chamber; and
        (c) repeating (a)-(b) until the layer has a desired thickness.

2. The method of claim 1, wherein the flow rate of the silicon containing gas is increased and the flow rate of the reducing gas is decreased over a period of time of about 10 to about 60 seconds.

3. The method of claim 1, wherein exposing the substrate to the silicon containing gas and the reducing gas comprises:
    providing the silicon containing gas at a flow rate of about 5 to about 50 sccm; and
    providing the reducing gas at a flow rate of about 5 to about 50 sccm.

4. The method of claim 1, wherein increasing the flow rate of the silicon containing gas while decreasing the flow rate of the reducing gas comprises:
    providing the silicon containing gas at a flow rate of about 5 to about 10 sccm and providing the reducing gas at a flow rate of about 5 to about 50 sccm for a period of time of about 10 to about 60 seconds; and
    subsequently providing the silicon containing gas at a flow rate of about 10 to about 20 sccm for a period of time of about 10 to about 60 seconds.

5. The method of claim 1, wherein the first flow rate is about 5 to about 20 sccm and the first period of time is about 10 to about 60 seconds.

6. The method of claim 1, wherein the second flow rate is about 5 to about 50 sccm and the second period of time is about 10 to about 60 seconds.

7. The method of claim 1, further comprising:
    exposing the substrate to the reducing gas prior to exposing the substrate to the silicon containing gas and the reducing gas.

8. The method of claim 7, wherein exposing the substrate to the reducing gas as recited in claim 7 comprises:
    providing the reducing gas at a flow rate of about 5 to about 50 sccm for a period of time of about 10 to about 80 seconds.

9. The method of claim 1, further comprising:
    exposing the substrate to the reducing gas after depositing the second layer atop the first layer.

10. The method of claim 9, wherein exposing the substrate to the reducing gas as recited in claim 9 comprises:
    providing the reducing gas at a flow rate of about 5 to about 50 sccm for a period of time of about 10 to about 60 seconds.

11. The method of claim 1, further comprising:
    exposing the substrate to the reducing gas after forming the first layer and prior to depositing the second layer.

12. The method of claim 11, wherein exposing the substrate to the reducing gas as recited in claim 11 comprises:
    providing the reducing gas at a flow rate of about 5 to about 50 sccm for a period of time of about 10 to about 60 seconds.

13. The method of claim 1, wherein the wherein the silicon containing gas is silane ($SiH_4$) and the reducing gas is hydrogen ($H_2$).

14. The method of claim 1, wherein the method is performed in a process chamber maintained at a pressure of about 10 to about 50 mTorr.

15. The method of claim 1, wherein the method is performed in a process chamber with a substrate temperature of about 200 to about 300 degrees Celsius.

16. A method of depositing a material atop a substrate, comprising:
    (a) flowing a silicon containing gas into a hot wire chemical vapor deposition (HWCVD) chamber at a first flow rate for a first period of time to form a first species that reacts with a substrate disposed in the HWCVD chamber;
    (b) subsequently flowing a reducing gas alone or in combination with an inert carrier gas into the HWCVD chamber at a second flow rate for a second period of time to form a second species that reacts with the substrate disposed in the HWCVD chamber; and
    (c) repeating (a)-(b) until the layer has a desired thickness.

17. The method of claim 16, wherein the first flow rate is about 5 to about 50sccm and the first period of time is about 10 to about 60 seconds.

18. The method of claim 16, wherein the second flow rate is about 5 to about 50 sccm and the second period of time is about 10 to about 60 seconds.

19. The method of claim 16, wherein the silicon containing gas is silane ($SiH_4$) and the reducing gas is hydrogen ($H_2$).

* * * * *